(12) United States Patent  
Numai

(10) Patent No.: US 6,665,330 B1
(45) Date of Patent: Dec. 16, 2003

(54) SEMICONDUCTOR DEVICE HAVING A SEMICONDUCTOR RING LASER WITH A CIRCULARLY FORMED RIDGE OPTICAL WAVEGUIDE

(75) Inventor: Takahiro Numai, Naka-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 139 days.

(21) Appl. No.: 09/659,842

(22) Filed: Sep. 11, 2000

(30) Foreign Application Priority Data

Sep. 14, 1999 (JP) .......................................... 11-260238

(51) Int. Cl.⁷ .............................. H01S 3/083; H01S 5/00
(52) U.S. Cl. ........................................... 372/94; 372/46
(58) Field of Search ..................................... 372/46, 94

(56) References Cited

U.S. PATENT DOCUMENTS

| | | | |
|---|---|---|---|
| 3,373,650 A | | 3/1968 | Killpatrick .................. 356/472 |
| 3,467,472 A | | 9/1969 | Killpatrick .................. 356/472 |
| 3,879,130 A | | 4/1975 | Greenstein ............ 356/106 LR |
| 4,120,587 A | | 10/1978 | Vali et al. ............. 356/106 LR |
| 4,229,106 A | | 10/1980 | Dorschner ................. 356/350 |
| 4,429,997 A | | 2/1984 | Matthews ................... 356/350 |
| 4,431,308 A | | 2/1984 | Mitsuhashi et al. ......... 356/350 |
| 4,521,110 A | | 6/1985 | Roberts et al. ............. 356/350 |
| 4,718,766 A | | 1/1988 | Greenstein ................. 356/350 |
| 4,913,548 A | * | 4/1990 | Vick .......................... 356/350 |
| 5,037,203 A | | 8/1991 | Yeh ............................ 356/350 |
| 5,132,983 A | * | 7/1992 | Behfar-Rad ................... 372/94 |
| 5,408,492 A | * | 4/1995 | Vossler et al. ................ 372/94 |
| 5,463,705 A | * | 10/1995 | Clauberg et al. .............. 385/14 |
| 5,757,829 A | * | 5/1998 | Jiang et al. .................. 372/31 |
| 5,764,681 A | * | 6/1998 | Ballantyne et al. ........... 372/94 |
| 5,812,571 A | * | 9/1998 | Peters ......................... 372/36 |
| 6,044,098 A | * | 3/2000 | Sun ............................. 372/46 |
| 6,164,836 A | * | 12/2000 | Yamada et al. ................ 385/88 |
| 6,219,366 B1 | | 4/2001 | Furushima .................... 372/50 |
| 6,304,329 B1 | * | 10/2001 | Nitta et al. .................. 356/459 |

FOREIGN PATENT DOCUMENTS

| | | |
|---|---|---|
| GB | 2 017 392 | 10/1979 |
| JP | 57-43486 | 3/1982 |
| JP | 59-41883 | 3/1984 |
| JP | 60-148185 | 8/1985 |
| JP | 3-145179 | 6/1991 |
| JP | 4-174317 | 6/1992 |
| JP | 5-288556 | 11/1993 |
| JP | 6-38529 | 2/1994 |
| JP | 6-140364 | 5/1994 |
| JP | 7-131123 | 5/1995 |
| JP | 7-139954 | 6/1995 |
| JP | 7-146150 | 6/1995 |
| JP | 8-18166 | 1/1996 |
| JP | 8-125251 | 5/1996 |

* cited by examiner

Primary Examiner—Quyen Leung
Assistant Examiner—Davienne Monbleau
(74) Attorney, Agent, or Firm—Fitzpatrick, Cella, Harper & Scinto

(57) ABSTRACT

A semiconductor device having a semiconductor ring laser and a base member with an electrode. The semiconductor ring laser has a circularly formed ridge optical waveguide. A concave region exists at the inside or outside of the waveguide. An electrode layer is provided over the waveguide and concave region, and the electrode and the electrode layer are electrically connected to each other through a conductive member existing in the concave region.

11 Claims, 5 Drawing Sheets

SEMICONDUCTOR DEVICE HAVING A SEMICONDUCTOR RING LASER WITH A CIRCULARLY FORMED RIDGE OPTICAL WAVEGUIDE

BACKGROUND OF THE INVENTION

1. Field of the Invention

This invention relates to a semiconductor device and a method of fabricating the semiconductor device.

More particularly, the present invention relates to a gyro having a semiconductor ring laser and a method of fabricating such a gyro.

2. Related Background Art

Gyros for detecting the angular velocity of a moving object such as mechanical gyros provided with a rotor or an oscillator and optical gyros are known.

Particularly, optical gyros are innovative in the field of gyro technology because they can instantaneously start to operate and have a wide dynamic range. Optical gyros include ring laser type gyros, optical fiber gyros and passive type oscillator gyros. Of these, ring laser type gyros realized by using gas are the earliest corners in the race of technological development and have already found practical applications in the field of aeronautics. In recent years, there have been proposed compact and high precision semiconductor ring laser type optical gyros formed on a semiconductor substrate to achieve an enhanced degree of integration. For example, such optical gyros are described in U.S. Pat. No. 4,431,308 (Japanese Patent Application Laid-Open No. 57-43486) and Japanese Patent Applications Laid-Open Nos. 4-174317 and 5-288556.

Of the above listed patent documents, U.S. Pat. No. 4,431,308 describes a gyro that utilizes the phenomenon that the semiconductor laser element contained in it changes its terminal voltages as a function of revolution and is adapted not to take out any light to the outside from the semiconductor laser element. Referring to FIG. 8 of the accompanying drawings, the semiconductor laser element 100 has electrodes 101 and 102 that are vertically oppositely arranged. Additionally, there are shown a DC blocking capacitor 103, an output terminal 104 and a resistor 105. As shown in FIG. 8, the semiconductor laser element that operates as laser element in a ring laser device is connected to a drive power source 106 and the frequency difference (beat frequency) between the beam circulating clockwise and the beam circulating counterclockwise is detected as the difference in the terminal voltages that is produced when the device shows a certain angular velocity.

However, known semiconductor ring laser type optical gyros have been proposed mainly to prove their functional advantages. Particularly, gyros of the type that utilizes the phenomenon that the semiconductor laser element contained in it changes its terminal voltages as a function of revolution and is adapted not to take out any light to the outside from the semiconductor laser element have never been marketed. In other words, known semiconductor ring laser type optical gyros have not been scrutinized from the viewpoint of assembling particularly in terms of radiation of heat, cost, stability for position control and reliability of the gyro.

Therefore, it is the object of the present invention to provide a semiconductor device having a semiconductor ring laser that excels in heat radiativity, cost, stability for position control and reliability.

SUMMARY OF THE INVENTION

According to an aspect of the present invention, there is provided a semiconductor device comprising a semiconductor ring laser wherein the semiconductor ring laser having a circularly formed ridge optical waveguide and a base member having an electrode on a surface thereof are contacted with each other through the intermediary of a conductive member in a concave region of the semiconductor ring laser.

Preferably, in the semiconductor device according to the present invention, the semiconductor ring laser is adapted to generate circularly counterpropagating laser beams respective oscillation frequencies of which beams differ from each other.

Alternatively, in the semiconductor device according to the present invention, the semiconductor ring laser is adapted to generate circularly counterpropagating laser beams respective oscillation frequencies of which beams differ from each other when the device is held stationary.

In another aspect of the present invention, there is provided a method for fabricating a semiconductor device comprising a semiconductor ring laser which comprises the step of contacting a semiconductor ring laser having a circularly formed ridge optical waveguide and a base member having an electrode on a surface thereof with each other through the intermediary of a conductive member in a concave region of the semiconductor ring laser.

DESCRIPTION OF THE PREFERRED EMBODIMENTS

Figure 1:
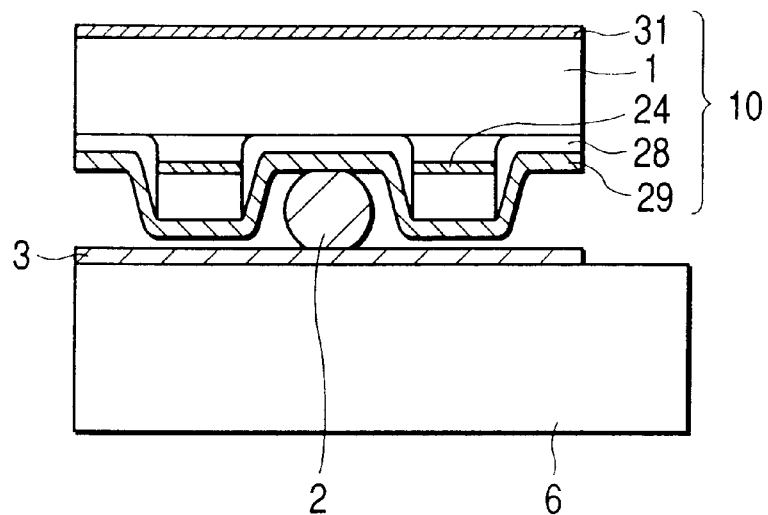
FIG. 1 is a schematic cross sectional view of an embodiment of semiconductor device according to the present invention, illustrating the assembled state of its semiconductor ring laser.

Referring firstly to FIG. 1, reference numeral 10 generally denotes a semiconductor ring laser having a circularly formed ridge optical waveguide, shown in cross section, numeral 1 a substrate, numeral 24 an active layer, numeral 28 a passivation film, and numeral 31 a rear surface electrode. In FIG. 1, reference numeral 6 denotes a base member and a reference numeral 3 denotes a second electrode formed on the base member. The semiconductor ring laser 10 and the second electrode are contacted on bump 2.

As shown in FIG. 1, the first electrode 29 and the second electrode 3 are contacted on bump 2 arranged in a concave region located at the center of the ring resonator.

With this arrangement, the semiconductor ring laser 10 and the base member 6 can have a stable positional relationship. More specifically, the base member 6, the second electrode 3 and the bump 2 define a convex region, which convex region fits well in the concave region located at the center of the ring resonator to establish a stable positional relationship. If the base member 6 is provided with a heat sink feature, the heat generated by the active layer 24 can be transmitted to the base member 6 by way of the bump 2, to make the semiconductor resonator radiate heat highly and efficiently. Materials that can be used for the bump 2 include solder and Au. Au will make the bump 2 operate as ideal heat sink. The material of the bump 2 is, however, by no means limited to those listed above.

The optical waveguide is free from any potential damage in the assembling process and hence the active layer 24 is held free from stress if the bump 2 is not directly held in contact with (the convex region of) the optical waveguide. Then, the assembled device can enjoy a long service life and a high reliability.

Figure 2:
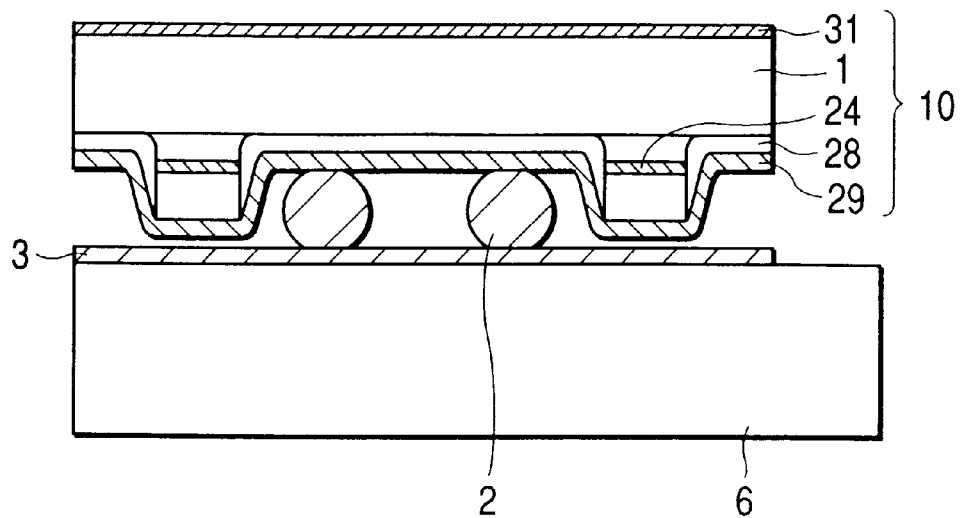
FIG. 2 is a schematic cross sectional view of another embodiment of semiconductor device according to the present invention, illustrating the assembled state of its semiconductor ring laser.

While only a single bump 2 is shown in FIG. 1, alternatively the ring layer and the base member may be contacted on a plurality of bumps as shown in FIG. 2.

Materials that can be used for a heat sink for the purpose of the invention include Cu, Si, SiC, AlN and diamond.

While an anode and a cathode are arranged respectively at opposite surfaces (31, 29) of the wafer in FIG. 1, they may be arranged on a same surface.

Figure 3A:
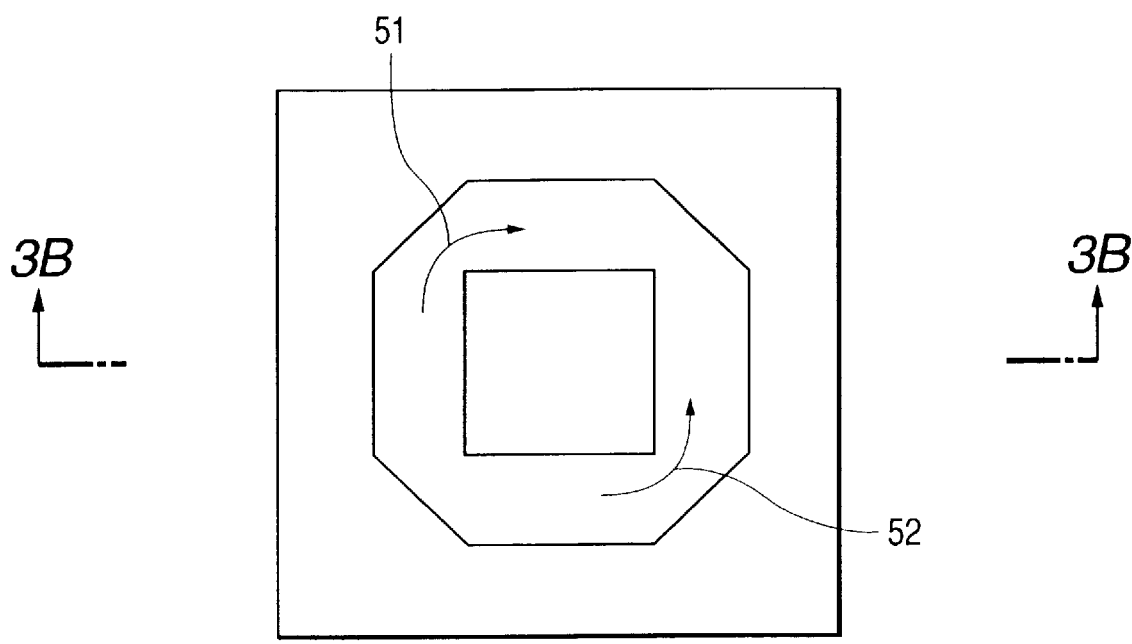
FIG. 3A is a schematic plan view of a semiconductor ring laser that can be used for a semiconductor device according to the present invention.
Figure 3B:
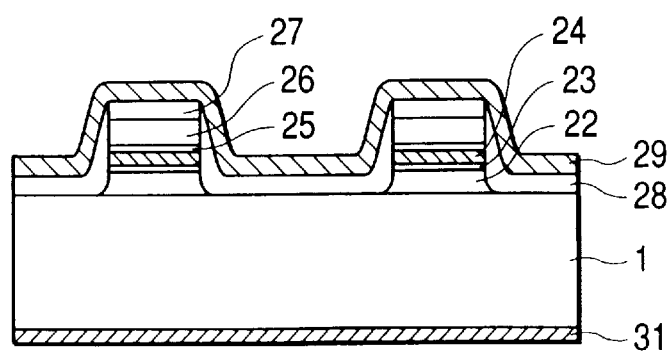
FIG. 3B is a schematic cross sectional view of the semiconductor ring laser of FIG. 3A.

FIG. 3A is a schematic plan view of such a semiconductor ring laser that can be used for a semiconductor device according to the present invention as numeral 10 in FIG. 1, and FIG. 3B is a schematic cross sectional view of the semiconductor ring laser taken along line 3B—3B in FIG. 3A.

While FIG. 3B shows the arrangement of the layers of the semiconductor ring laser, the layer arrangement is by no means limited to the illustrated one in the figure and some other layer arrangement may be used for it.

In FIG. 3B, there are shown a semiconductor substrate 1, a buffer layer 22, an optical guiding layer 23, an active layer 24, another optical guiding layer 25, a cladding layer 26, a cap layer 27, a passivation film 28 and a first electrode 29.

The configuration of the semiconductor ring laser is not limited to the one illustrated in FIG. 3A and the semiconductor ring laser may take any other form, which may be circular, hexagonal, tetragonal or trigonal, so long as it shows desired characteristics. Additionally, it is by no means necessary that the ridge-shaped optical waveguide is arranged along the entire periphery of the semiconductor ring laser so long as the semiconductor ring laser and the base member contact on the bump by utilizing substantially the concave region.

EMBODIMENTS

Embodiment 1

Figure 4:
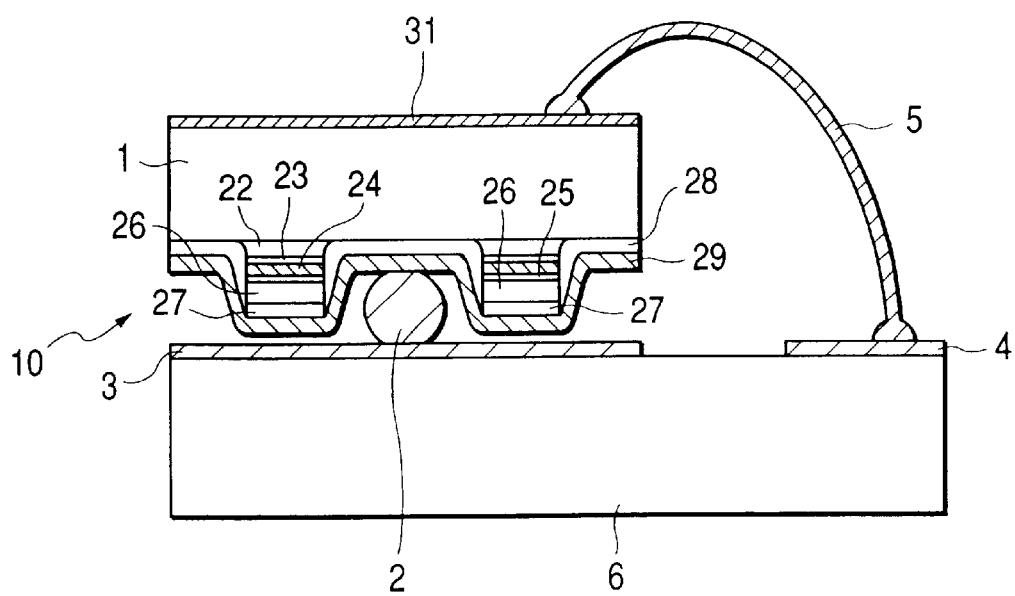
FIG. 4 is a schematic cross sectional view of still another embodiment of semiconductor device, illustrating the assembled state of its semiconductor ring laser.

FIG. 4 is a schematic cross sectional view of an embodiment of semiconductor device according to the present invention, illustrating the assembled state of its semiconductor ring laser. Referring to FIG. 4, there are shown a semiconductor substrate 1, a bump 2 as the conductive member, a second electrode 3 formed on a heat sink 6, a fourth electrode 4 also formed on the heat sink, a wire 5, a first electrode 29 and a third electrode 31. The optical waveguide of this semiconductor ring laser 10 has a configuration same as the one illustrated in FIGS. 3A and 3B.

In FIG. 4, there are also shown a semiconductor substrate 1, a buffer layer 22, an optical guiding layer, an active layer 24, another optical guiding layer 25, a cladding layer 26, a cap layer 27 and a passivation layer 28.

The structure of the semiconductor ring laser of this embodiment will be discussed further by referring to FIG. 4. Firstly, a buffer layer 22 (0.05 $\mu$m thick), an undoped InGaAsP optical guiding layer having 1.3 $\mu$m composition 23 (0.15 $\mu$m thick), an undoped InGaAsP active layer having 1.55 $\mu$m composition 24 (0.1 $\mu$m thick), an undoped InGaAsP optical guiding layer having 1.3 $\mu$m composition 25 (0.15 $\mu$m thick), a p-InP cladding layer 26 (2 $\mu$m thick) and a p-InGaAsP cap layer 27 (0.3 $\mu$m thick) are sequentially made to grow on an n-InP substrate 1 (350 $\mu$m thick) by means of a metal organic vapor phase epitaxial growth (MOVPE) techniques.

After the crystal growth, an optical waveguide is formed by etching to produce a ring resonator. A width of the stripe of the waveguide was set to 5 $\mu$m and a length of each side of the optical path was set to 15 $\mu$m. A passivation film 28 is formed on the entire surface of the wafer. Thereafter, the passivation film 28 is removed only from the top of the cap layer 27 in order to make an electric current flow through the device. Subsequently, an anode 29 of Cr/Au is formed on the entire surface of the wafer. The Cr/Au anode is plated with Au to a relatively large thickness of several micrometers so as to dissipate heat from the semiconductor ring laser. On the other hand, a cathode 31 of AuGe/Ni/Au is formed on the n-InP substrate 1. The device size can be reduced by making the anode and the cathode sandwich the wafer in a manner as described above.

Now, the process of mounting the semiconductor ring laser on a base member will be described below. A base member 6 made of high resistance silicon is used in order to make it operate as a heat sink. Then, electrodes 3 and 4 are selectively formed on the base member 6. Since the heat sink itself is electrically highly resistive, the electrode 3 and the electrode 4 are electrically insulated from each other. Then, a spherical Au bump 2 is formed on the electrode 3. Thereafter, the semiconductor ring laser 10 is placed on the bump 2 so as to house the bump in the concave region of the semiconductor ring laser. Then, the base member 6, the bump 2 and the semiconductor ring laser 10 are bonded together under pressure. Note that the bump 2 may be made of solder. However, if solder is used for the bump 2, it has to be heated to temperature higher than the melting point of solder after placing the related components in position as occasion demands. Lastly, the electrode 31 and the electrode 4 are connected to each other by way of an Au wire 5 having a diameter of 30 $\mu$m.

When the semiconductor ring laser thus mounted on the base member was fed with a drive current in an experiment, the oscillation threshold of the drive current was as low as 0.2 mA at room temperature due to the efficient heat radiation of the device. It was also found that the drive current for operating the gyro is as low as 0.5 mA. The oscillation wavelength $\lambda_0$ was 1.55 $\mu$m in vacuum.

Now, the use of the semiconductor ring laser mounted on the base member as shown in FIG. 4 as a gyro will be discussed below.

If the semiconductor ring laser shows a plan view as illustrated in FIG. 3A, there exist laser beams 51 and 52 that have wavelengths $\lambda_1$ and $\lambda_2$ and circularly propagate clockwise and counterclockwise in the ring laser, respectively. Generally speaking, $\lambda_1 = \lambda_2$ holds when the semiconductor ring laser is stationary. When the gyro is driven to rotate clockwise or counterclockwise with an angular velocity, the wavelengths of the two beams come to differ from each other. Thus, the difference between the frequencies that corresponds to the difference between the oscillation wavelengths can be detected as a change in voltage of a beat signal.

More specifically, an electric current is introduced at the electrode 3 and the change in the terminal voltage of the semiconductor ring laser caused by the rotation is detected at the same electrode 3 as used for introducing the electric current. It is also possible to detect the beam signal as a change in the electric current or the impedance.

Figure 5:
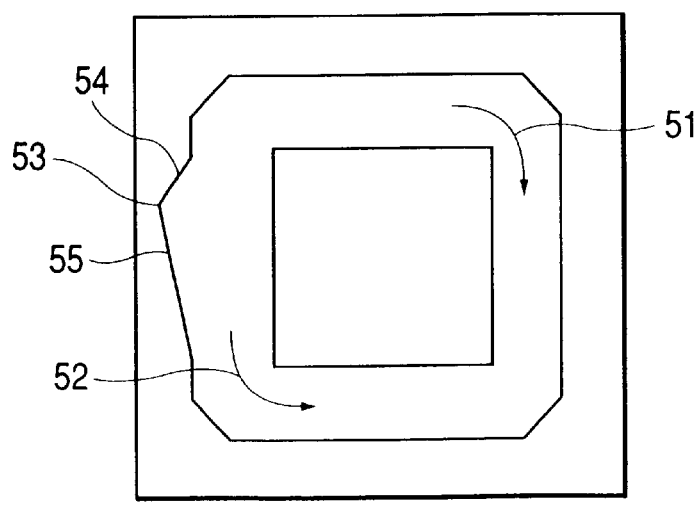
FIG. 5 is a schematic plan view of the semiconductor ring laser of FIG. 4.

If the semiconductor ring laser is made to have a profile as shown in FIG. 5, where an asymmetrically tapered region 53 is provided, the oscillation frequencies shows a difference even when the gyro is held stationary to produce a beat frequency that corresponds to the difference. Therefore, when the gyro is driven to rotate and show an angular velocity, it is possible to tell if the gyro is driven to rotate clockwise or counterclockwise by detecting the discrepancy between the beat frequency of the rotating gyro and that of the gyro when the gyro is held stationary.

Said tapered region includes a first tapered part 54 where the width of the optical waveguide gradually increases in the direction of propagation of laser beam 52 and a second tapered part 55 where the width of the optical waveguide gradually decreases in the direction of propagation of the laser beam 52.

Preferably, each of the first tapered part 54 and the tapered part 55 tapers at an acute angle to a surface of a region of the optical waveguide having a constant width.

It is needless to say that the optical waveguide may have any profile other than the tapered profile so long as the oscillation frequencies can be different from each other when the gyro is held stationary.

Figure 6:
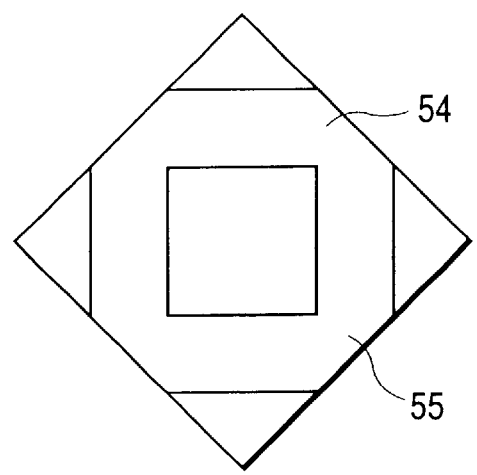
FIG. 6 is a schematic plan view of another semiconductor ring laser that can be used for a semiconductor device according to the present invention.

While an InGaAsP type material is used as semiconductor material for this embodiment, a GaAs type material, a ZnSe type material, an InGaN type material, an Al-GaN type material and so forth may be also used for the purpose of the present invention. The shape of the optical path of the optical waveguide is not limited to tetragonal as shown in FIG. 2 and may be hexagonal, trigonal or circular. FIG. 6 is a schematic plan view of another semiconductor ring laser that can be used for a semiconductor device according to the present invention and is provided with corner parts 55 at the edges of the device. If the edges of the heat sink and the corner parts are aligned in a semiconductor ring laser having such a configuration, it is possible to take out a laser beam from the semiconductor ring laser to the outside without any fraction of the laser beam cut off by the substrate so that any undesired loss of laser beam can be avoided.

Embodiment 2

Figure 7:
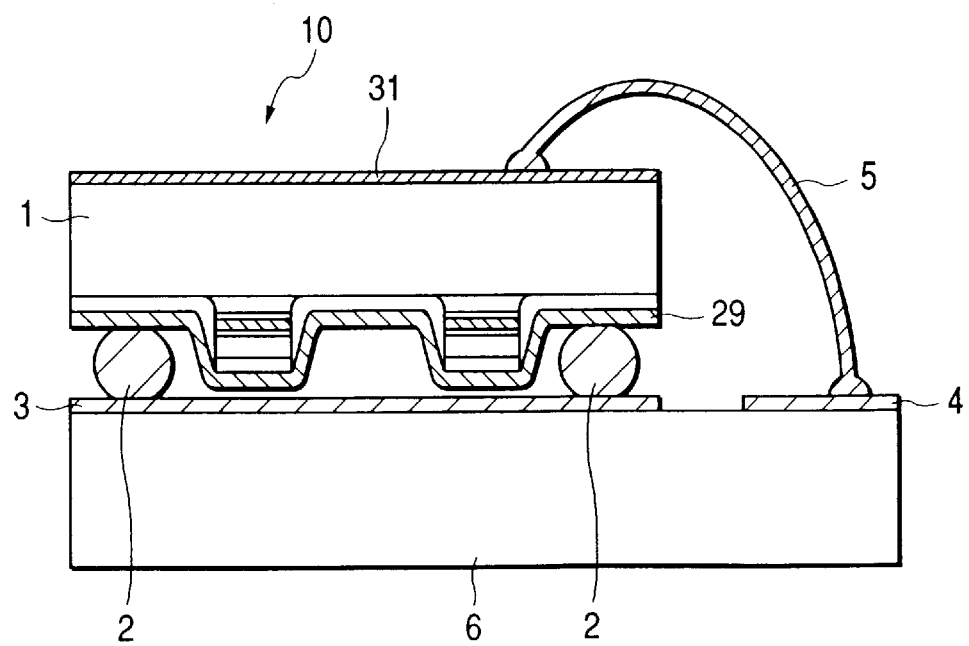
FIG. 7 is a schematic cross sectional view of still another embodiment of semiconductor device, illustrating the assembled state of its semiconductor ring laser.
Figure 8:
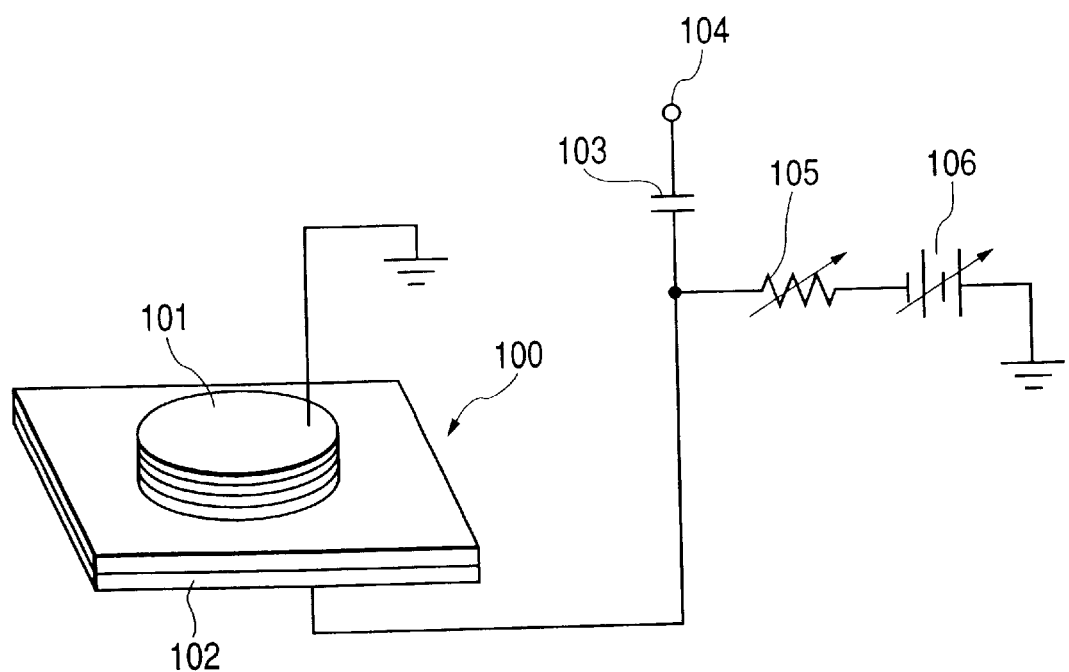
FIG. 8 is a schematic circuit diagram of a known laser element.

Now, another embodiment of the invention will be described by referring to FIG. 7.

This embodiment differs from Embodiment 1 in that bumps are arranged not inside but outside the concave region of the ring laser in order to contact the semiconductor ring laser 10 and the electrode 3 on the bumps.

With this arrangement, the distance separating the bumps can be increased in comparison with that in a conventional device having the same size, which brings about an advantageous effect of providing a stable embodiment.

It is needless to say that one of the bumps may be arranged inside the concave region while the other is arranged outside the concave region.

As described above, the present invention makes it possible to mount a semiconductor device having a semiconductor ring laser that excels in heat radiativity, cost, stability for position control and reliability.

What is claimed is:

1. A semiconductor device comprising:

a semiconductor ring laser having a circularly formed ridge optical waveguide having an active layer, and a concave portion located inside of the optical waveguide; and a base member having an electrode on a surface thereof, wherein an electrode layer is provided on the optical waveguide and the concave region, and the electrode and the electrode layer are electrically connected to each other through a conductive member existing in the concave region.

2. A semiconductor device according to claim 1, wherein said conductive member has the shape of a bump.

3. A semiconductor device according to claim 1, wherein said semiconductor ring laser generates two laser beams which circularly propagate in opposite directions, said beams having different oscillation frequencies.

4. A semiconductor device according to claim 3, wherein a change in a beat signal caused by a rotary motion of said semiconductor ring laser is detected as a change in voltage or electric current or impedance.

5. A semiconductor device according to claim 1, wherein said semiconductor ring laser generates two laser beams which circularly propagate in opposite directions, said beams having different oscillation frequencies when the device is held stationary.

6. A semiconductor device according to claim 5, wherein a change in a beat signal caused by a rotary motion of said semiconductor ring laser is detected as a change in voltage or electric current or impedance.

7. A semiconductor device according to claim 1, wherein the waveguide of said semiconductor ring laser is ring-shaped and has an asymmetrically tapered region.

8. A semiconductor device according to claim 7, wherein said tapered region includes a first tapered part where a width of the optical waveguide gradually increases in a direction of propagation of a laser beam and a second tapered part where the width of the optical waveguide gradually decreases in the direction of propagation of the laser beam.

9. A semiconductor device according to claim 8, wherein said first tapered part tapers at an acute angle to a non-tapered region of the optical waveguide which is adjacent to said first tapered part and said second tapered part tapers at an acute angle to a non-tapered region of the optical waveguide which is adjacent to said second tapered part.

10. A semiconductor device according to claim 1, wherein said electrode layer and said electrode are not in physical contact with each other.

11. A semiconductor device according to claim 1, wherein said electrode layer is provided on the entire inner surface of the concave region.

* * * * *